United States Patent [19]
Frisina et al.

[11] Patent Number: 5,900,662
[45] Date of Patent: May 4, 1999

[54] MOS TECHNOLOGY POWER DEVICE WITH LOW OUTPUT RESISTANCE AND LOW CAPACITANCE, AND RELATED MANUFACTURING PROCESS

[75] Inventors: Ferruccio Frisina, Sant'Agata Li Battiati; Giuseppe Ferla, Catania; Salvatore Rinaudo, S. Marco D'Alunzio, all of Italy

[73] Assignees: SGS Thomson Microelectronics S.r.l., Agrate Brianza, Italy; Consorzio per la Ricerca sulla Microelettronica nel Mezzogiorno, Catania, Italy

[21] Appl. No.: 08/740,713

[22] Filed: Nov. 4, 1996

[30] Foreign Application Priority Data

Nov. 6, 1995 [EP] European Pat. Off. ............. 95830468

[51] Int. Cl.$^6$ .................................................. H01L 29/62
[52] U.S. Cl. .......................... 257/341; 257/328; 257/139; 257/342; 257/345; 257/378; 257/401; 438/37; 438/156; 438/185; 438/209; 438/217
[58] Field of Search .................................. 251/328, 139, 251/341, 342, 345, 378, 401; 438/37, 156, 185, 209, 217

[56] References Cited

U.S. PATENT DOCUMENTS

| 4,072,975 | 2/1978 | Ishitani . |
| 4,345,265 | 8/1982 | Blanchard .................................. 357/23 |
| 4,376,286 | 3/1983 | Lidow . |

(List continued on next page.)

FOREIGN PATENT DOCUMENTS

| A-0 119 400 | 9/1984 | European Pat. Off. ......... H01L 29/78 |
| A-0 211 972 | 3/1987 | European Pat. Off. ......... H01L 29/78 |
| A-0 237 932 | 9/1987 | European Pat. Off. ......... H01L 29/60 |
| A-0 252 236 | 1/1988 | European Pat. Off. ......... H01L 29/78 |
| A-0 279 403 | 8/1988 | European Pat. Off. ......... H01L 29/78 |
| A-0 304 839 | 3/1989 | European Pat. Off. ......... H01L 21/28 |
| A-0 358 389 | 3/1990 | European Pat. Off. ......... H01L 29/06 |
| A-0 393 949 | 10/1990 | European Pat. Off. ......... H01L 29/78 |
| A-0 405 138 | 1/1991 | European Pat. Off. ......... H01L 29/72 |
| A-0 543 313 | 5/1993 | European Pat. Off. ......... H01L 29/78 |
| A-0 632 503 | 1/1995 | European Pat. Off. ......... H01L 29/06 |
| A-0 671 769 | 9/1995 | European Pat. Off. ......... H01L 29/78 |
| A-0 685 886 | 12/1995 | European Pat. Off. ......... H01L 23/48 |
| A-2 640 081 | 9/1990 | France ............................ H01L 27/10 |
| A-94 11904 | 5/1994 | WIPO ............................. H01L 29/78 |

OTHER PUBLICATIONS

European Search Report from European Patent Application No. 95830454.5, filed Oct. 30, 1995.
European Search Report from European Patent Application 95830418.0, filed Oct. 9, 1996.
European Search Report from European Patent Application 95830055.0, filed Feb. 24, 1995.
European Search Report from European Patent Application 95830535.1, filed Dec. 22, 1995.
European Search Report from European Patent Application No. 95830453.7, filed Oct. 30, 1995.
European Search Report from European Patent Application 95830542.7, filed Dec. 28, 1995.
Mena J., et al., "High Frequency Performance of VDMOS Power Transistors", International Electron Devices Meeting. Technical Digest, Washington, D.C., USA, 8–10 Dec. 1980, 1980 New York, NY, USA.
Patent Abstracts of Japan, vol. 014, No. 387 (E–0967), Aug. 21, 1990 & JP–A–02 143566 (Toshiba Corp.).

(List continued on next page.)

*Primary Examiner*—Edward Wojciechowicz
*Attorney, Agent, or Firm*—Wolf, Greenfield & Sacks, P.C.

[57] ABSTRACT

A MOS-gated power device includes a plurality of elementary functional units, each elementary functional unit including a body region of a first conductivity type formed in a semiconductor material layer of a second conductivity type having a first resistivity value. Under each body region a respective lightly doped region of the second conductivity type is provided having a second resistivity value higher than the first resistivity value.

65 Claims, 3 Drawing Sheets

U.S. PATENT DOCUMENTS

| | | |
|---|---|---|
| 4,593,302 | 6/1986 | Lidow . |
| 4,605,948 | 8/1986 | Martinelli ................................. 357/34 |
| 4,680,853 | 7/1987 | Lidow . |
| 4,901,127 | 2/1990 | Chow et al. ........................... 357/23.4 |
| 4,927,772 | 5/1990 | Arthur et al. ............................... 437/6 |
| 4,963,972 | 10/1990 | Shinohe et al. ........................... 357/38 |
| 5,008,725 | 4/1991 | Lidow . |
| 5,015,593 | 5/1991 | Yawata et al. ........................... 437/25 |
| 5,043,781 | 8/1991 | Nishiura et al. ....................... 357/23.6 |
| 5,160,985 | 11/1992 | Akiyama ................................ 257/328 |
| 5,164,804 | 11/1992 | Terashima .............................. 257/328 |
| 5,208,471 | 5/1993 | Mori et al. .............................. 257/327 |
| 5,286,984 | 2/1994 | Nakagawa et al. ..................... 257/139 |
| 5,382,538 | 1/1995 | Zambrano . |
| 5,397,728 | 3/1995 | Sasaki et al. ............................. 437/44 |
| 5,489,799 | 2/1996 | Zambrano . |
| 5,508,217 | 4/1996 | Sawada ..................................... 437/40 |
| 5,621,234 | 4/1997 | Kato ...................................... 257/339 |
| 5,670,392 | 9/1997 | Ferla et al. ............................... 437/29 |

OTHER PUBLICATIONS

Patent Abstracts of Japan, vol. 005, No. 040 (E–049), Mar. 17, 1981 & JP–A–55 163877 (Toshiba Corp.).

Patent Abstracts of Japan, vol. 015, No. 442 (E–1131), Nov. 11, 1991 & JP–A–03 185737 (Toshiba Corp.).

Patent Abstracts of Japan, vol. 011, No. 231 (E–527), Jul. 28, 1987 & JP–A–62 047162 (Matsushita Electric Works Ltd.).

Patent Abstracts of Japan, vol. 014, No. 038 (E–878), Jan. 24, 1990 & JP–A–01 272163 (Fuji Electric Co. Ltd.).

Patent Abstracts of Japan, vol. 017, No. 039 (E–1311), Jan. 25, 1993 & JP–A–04 256367 (Hitachi Ltd.).

Patent Abstracts of Japan, vol. 017, No. 213 (E–1356), Apr. 26, 1993 & JP–A–04 349660 (Toshiba Corp.).

Patent Abstracts of Japan, vol. 008, No. 053 (E–231), Mar. 9, 1984 & JP–A–58 206174 (Tokyo Shibaura Denki KK).

Semiconductor Science and Technology, Apr. 1993, UK, vol. 8, No. 4, oo 488–494, Galvagno G., et al. "Diffusion and Outdiffusion of Aluminum Implanted into Silicon".

MOS TECHNOLOGY POWER DEVICE WITH LOW OUTPUT RESISTANCE AND LOW CAPACITANCE, AND RELATED MANUFACTURING PROCESS

BACKGROUND OF THE INVENTION

1. Field of the Invention

The present invention relates to a MOS-gated power device with low output resistance and low capacitance, and to a related manufacturing process. MOS-gated power devices include, for example, power MOSFETS, IGBTs, MOS-gated thyristors or other MOS-gated power devices.

2. Discussion of the Related Art

A primary goal of the designers of MOS-gated power devices is to reduce, as far as possible, the output resistance (or "on" resistance) and the various capacitances associated with the power device structure.

These parameters can be reduced by increasing the integration density of the elementary functional units (polygonal cells or stripes), which constitute a MOS-gated power device, by exploiting photolitographic techniques and manufacturing processes more and more similar to those used in Very Large Scale of Integration (VLSI) technologies.

However, the physical structure of the MOS-gated power devices limits the degree to which the integration density can be increased. These limits can be better understood considering the distinct components of the on resistance of a MOS-gated power device, which are: the channel resistance Rc, which is the component associated with the channel region of the MOS-gated power device; the accumulation region resistance Racc, which is the component associated with the surface region of those portions of the common drain layer (i.e. the lightly doped epitaxial layer wherein the elementary functional units are formed) disposed between the body regions of the elementary functional units; the JFET resistance Rjfet, which is the component associated with those portions of the common drain layer disposed between the depletion regions of the body regions of the elementary functional units; and the epitaxial layer resistance Repi, which is the component associated with those portions of the common drain layer beneath the body regions of the elementary functional units.

The channel resistance Rc and the accumulation region resistance Racc (both associated with regions near the surface of the common drain layer) can be reduced by scaling down the dimensions of the elementary functional units and by employing photolithographic machines with better optical resolution. Differently, the JFET resistance Rjfet and the epitaxial layer resistance Repi can be reduced only modifying the physical structure of the MOS-gated power devices. In fact, reducing the distance between the elementary functional units (cells or stripes), causes the Rjfet component to significantly increase, the increase being more pronounced the higher the resistivity of the common drain layer.

This means that in order to prevent the on resistance from significantly increasing, the minimum distance to which the elementary functional units of the MOS-gated power device must be kept increases with the increase of the resistivity of the common drain layer. By way of example, in devices designed to operated in a voltage range of approximately 60 V, the distance between the elementary functional units can be between 4 $\mu$m and 10 $\mu$m, while in the case of devices designed to operate in higher voltages of about 500 V, wherein the common drain layer is resistive, the distance is between 15 $\mu$m and 20 $\mu$m.

Therefore, if in the attempt to increase the integration density it is desired to reduce the distance between the elementary functional units (cells or stripes), so that the gate-drain (or feedback) capacitance can be reduced, without however increasing the output resistance of the MOS-gated power device, it is necessary to increase the doping concentration of the common drain layer. This however reduces the breakdown voltage of the MOS-gated power device.

One known technique to overcome this drawback is described in the U.S. Pat. No. 4376286: the doping concentration in the portions of the common drain layer between the elementary functional units is increased by means of an implant of N type dopants, without affecting the doping concentration of the common drain layer beneath the body regions of the elementary functional units. In this way, it is possible to reduce the distance between the elementary functional units (and consequently reducing the feedback capacitance of the MOS-gated power device), without increasing the Rjfet component of the on resistance.

One of the limitations of this technique is that only the JFET component of the on resistance can be reduced, but not the epitaxial layer resistance Repi. Furthermore, an additional mask may be required in the manufacturing process, to prevent the N type dopants from being implanted at the edge of the power MOS device chip.

In view of the state of the art described, it is an object of the present invention to provide a MOS-gated power device with a low output resistance and low capacitance, without negatively affecting the breakdown voltage.

SUMMARY OF THE INVENTION

According to the present invention, this and other objects are achieved in a MOS-gated power device comprising a plurality of elementary functional units, each elementary functional unit comprising a body region of a first conductivity type formed in a semiconductor material layer of a second conductivity type having a first resistivity value, wherein a respective lightly doped region of a second conductivity type is respectively disposed under each body region, each respective lightly doped region having a second resistivity value higher than said first resistivity value.

As a result of the present invention, and specifically due to the presence of the lightly doped regions under the body regions of the elementary functional units, a MOS-gated power device is provided which, for a given breakdown voltage, has a common drain layer with a lower resistivity than that which would be necessary in a conventional MOS-gated power device with the same breakdown voltage. The reduced resistivity of the common drain layer not only provides a decrease of the JFET component Rjfet, but also of the epitaxial layer component Repi of the output resistance of the MOS-gated power device. Furthermore, it is possible to reduce the distance between the elementary functional units without increasing the JFET component, thus reducing the gate-drain capacitance of the MOS-gated power device.

The structure according to the present invention is particularly suitable for MOS-gated power devices of low voltages (30–20 V), in which the dimension of the elementary functional units is comparable with the residual thickness of the epitaxial layer under the body regions.

BRIEF DESCRIPTION OF THE DRAWINGS

These and other features of the present invention will be made more evident by the following detailed description of one particular embodiment, illustrated as a non limiting example in the annexed drawings, wherein.

DETAILED DESCRIPTION

Figure 1:
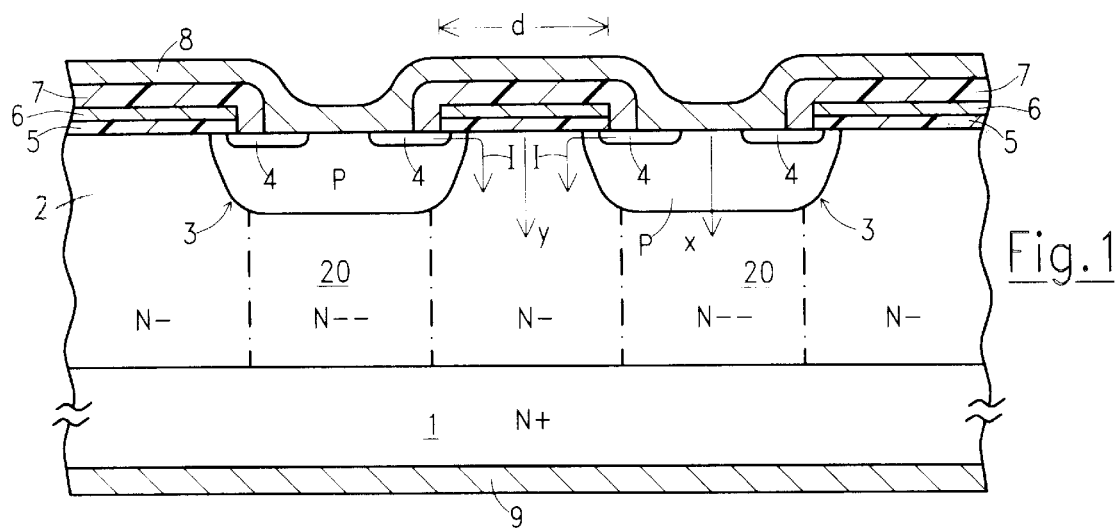
FIG. 1 is cross-sectional view of a MOS-gated power device according to the present invention.

With reference to the drawings, and specifically to FIG. 1, a MOS-gated power device chip according to the present invention comprises a heavily doped semiconductor substrate 1, over which a lightly doped semiconductor layer 2 is formed, for example by means of an epitaxial growth. In the example shown, referring to the case of an N channel power MOSFET, both the substrate 1 and the epitaxial layer 2 are of the N conductivity type; differently, in a P channel power MOSFET both the substrate 1 and the epitaxial layer 2 would be of the P conductivity type. Also, the substrate 1 and the epitaxial layer 2 could be of opposite conductivity types, as in the case of a Insulated Gate Bipolar Transistor (IGBT).

The epitaxial layer 2 forms a common drain layer for elementary functional units of the MOS-gated power device. Each elementary fiuctional unit comprise a body region 3 of the P conductivity type (or, more generally, of the opposite conductivity type of the epitaxial layer 2). The body regions 3 can have a polygonal layout (e.g. square or hexagonal), as in the case of "cellular" MOS-gated power devices, or alternatively they can be represented by elongated stripes (in which case FIG. 1 shows a cross-section in a direction transverse to the elongated stripes). Inside each body region 3, heavily doped source regions 4 of the N conductivity type (i.e. of the same conductivity type as the epitaxial layer 2) are provided.

The top surface of the epitaxial layer 2 is covered by an insulated gate layer comprising a thin gate oxide layer 5 and a polysilicon layer 6. Openings are provided in the insulated gate layer over each body region 3. The insulated gate layer is covered by an insulating material layer 7 in which contact windows are provided over each body region 3 to allow a source metal layer 8 to contact the source regions 4 and the body regions 3. A drain metal layer 9 is also provided on the bottom surface of the substrate 1. Although region 20 is illustrated as extending through the whole thickness of the epitaxial layer 2, one skilled in the art will appreciate that region 20 may extend only partially through epitaxial layer 2.

In the epitaxial layer 2, beneath each body region 3, a region 20 of the same conductivity type as but having a higher resistivity than the epitaxial layer 2 is provided which extends downwardly substantially for the whole thickness of the epitaxial layer 2, to the substrate 1.

As a result of the presence of the regions 20 beneath the body regions 3, it is possible to reduce the resistivity of the epitaxial layer 2 without decreasing the breakdown voltage of the MOS-gated power device, because the breakdown voltage of the MOS-gated power device depends on the resistivity and on the thickness of the portions of the common drain layer beneath the body regions, not on the portions of the common drain layer between the body regions. In other words, the presence of the lightly doped regions 20 under the body regions 3 allows achievement of the desired breakdown voltage even with an epitaxial layer having a lower resistivity than that necessary with conventional devices.

As a consequence of the decreased resistivity of the epitaxial layer 2, both the JFET component Rjfet and the epitaxial layer component Repi of the output resistance Ron of the MOS-gated power device are reduced, because the current flux I coming from the source regions and flowing towards the substrate 1 encounter a lower resistance.

Also, it is possible to reduce the distance d (FIG. 1) between adjacent elementary functional units without the drawback of an increase of the Rjfet component of the output resistance of the MOS-gated power device.

Figure 6:
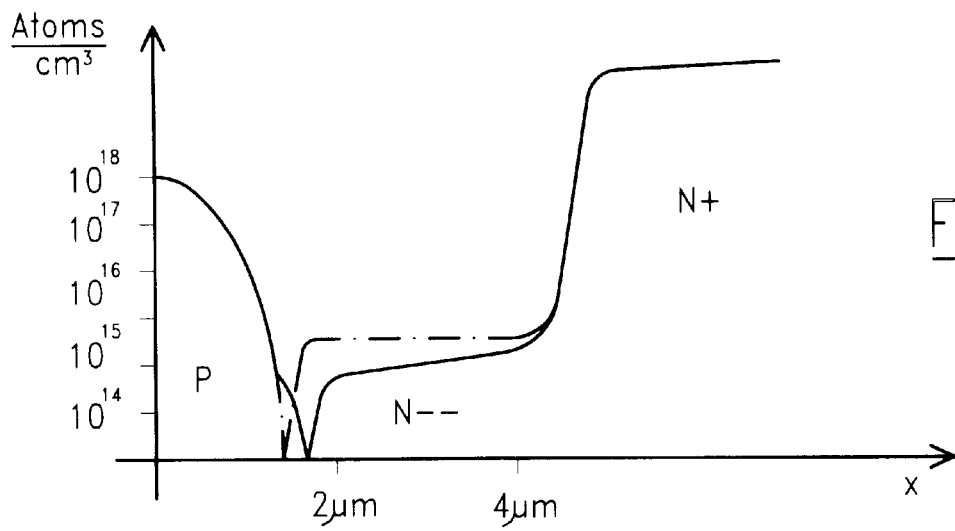
FIG. 6 is a comparative diagram showing doping profiles in the case of a conventional MOS-gated power device and in the case of the present invention.

FIG. 6 illustrates the doping profiles of the different semiconductor regions along the direction of arrow x of FIG. 1 beginning at the surface of body region 3 and moving through the depth of the device towards the substrate. The dash-and-dot line represents the doping profile of a conventional MOS-gated power device structure. The continuous line represents the doping profile of a device in accordance with the present invention.

Figure 7:
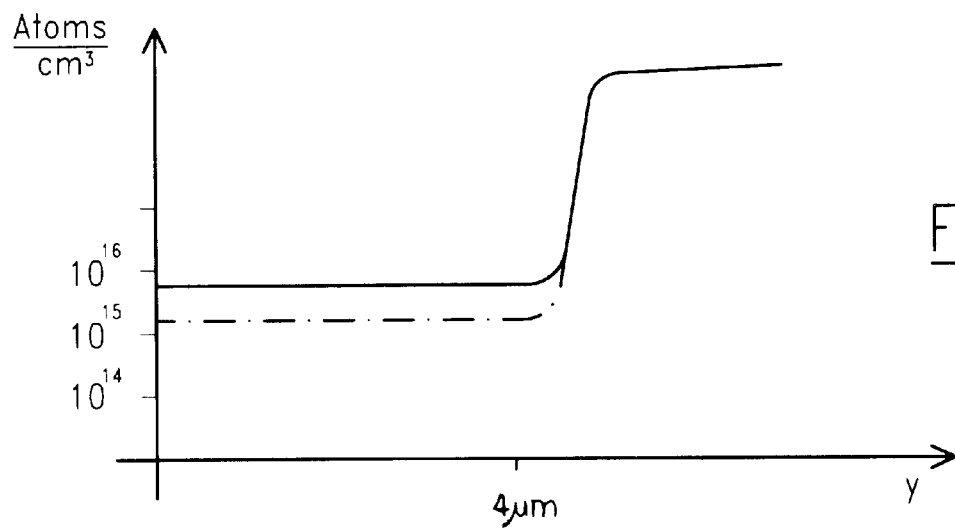
FIG. 7 is another comparative diagram showing doping profiles in the regions between elementary functional units of the MOS-gated power device.

FIG. 7 illustrates the doping profiles of the different semiconductor regions along the direction of arrow Y of FIG. 1 beginning at the surface of the lightly doped semiconductor layer 2 and moving through the depth of the device towards the substrate. The dash-and-dot line represents the doping profile of a conventional MOS-gated power device structure. The continuous line presents the doping profile of a device in accordance with the present invention.

FIGS. 6 and 7 illustrate depth value for low-voltage MOS-gated power devices. For high-voltage MOS-gated power devices, the width of the body region 3 can be, for example, approximately 20 μm and the depth of regions 20 can therefore be approximately 20 μm.

Figure 8:
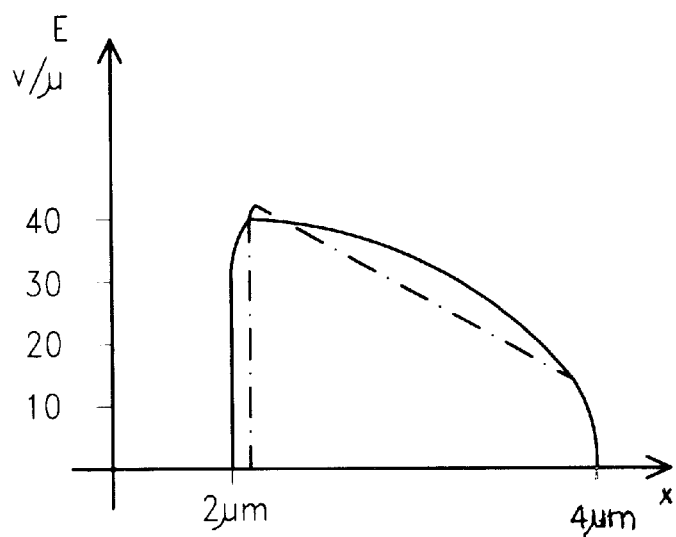
FIG. 8 is a comparative diagram showing the electric field distribution in the case of a conventional MOS-gated power device and in the case of the present invention.

FIG. 8 is a diagram showing the profile of the electric field E in the two cases of FIGS. 6 and 7. From FIG. 8, one skilled in the art will appreciate that in the structure of the present invention the breakdown voltage is higher (the area subtended by the curve of the electric field E is higher in the case of the structure of the present invention (continuous line) than in the case of a conventional structure (dash-and-dot line)).

Figure 2:
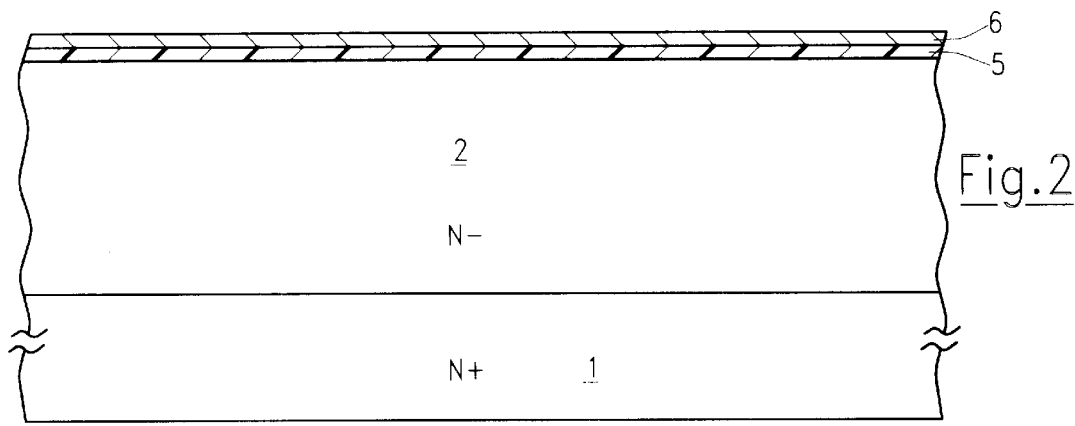
FIGS. 2 to 5 are cross-sectional views similar to FIG. 1 showing intermediate steps of a manufacturing process according to the present invention.

A manufacturing process according to the invention will now be described with reference to FIGS. 2-5A. Referring to FIG. 2, the lightly doped layer 2 is epitaxially grown over the heavily doped substrate 1, the thickness of the epitaxial layer 2 depends on the voltage class of the MOS-gated power device to be fabricated; for example, for low voltage devices the epitaxial layer 2 can have a thickness of about 2 or 5 μm. However, in conventional devices the resistivity of the epitaxial layer is determined on the basis of the desired breakdown voltage of the MOS-gated power device (for example 1 ohm×cm for a breakdown voltage of 60 V), in the present invention the epitaxial layer 2 has a resistivity which is lower than that necessary to achieve the same desired breakdown voltage (for example 0.6 ohm×cm).

Over the surface of the epitaxial layer 2 a thin oxide layer 5 is formed, for example by means of a thermal growth or, alternatively, a thick field oxide and an active area are formed. A polysilicon layer 6 is then deposited over the oxide layer 5.

Figure 3:
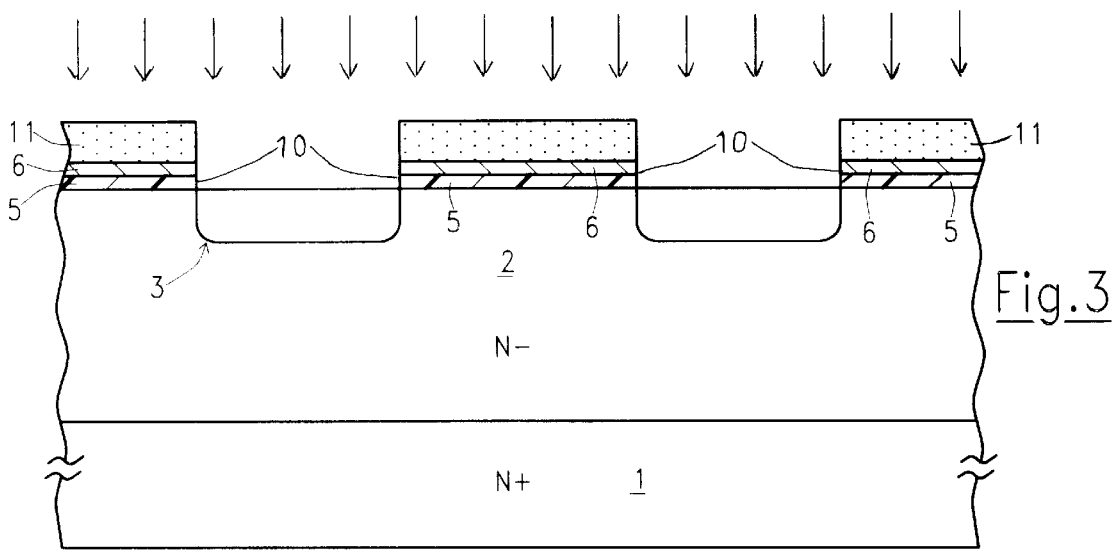

As illustrated in FIG. 3, the polysilicon layer 6 and the oxide layer 5 are then selectively removed from the surface of the epitaxial layer 2 to form openings 10. This step involves depositing a photoresist layer 11, the selectively exposing the photoresist layer 11 to a light source by means of a mask carrying the pattern of the openings 10, selectively removing the photoresist layer 1 1, and etching the polysilicon and oxide layers 5, 6 where they are not covered by the photoresist layer 11. The openings 10 can have a polygonal layout (for example square or hexagonal, i.e., a cellular layout), or they can be elongated stripes.

Figure 4:
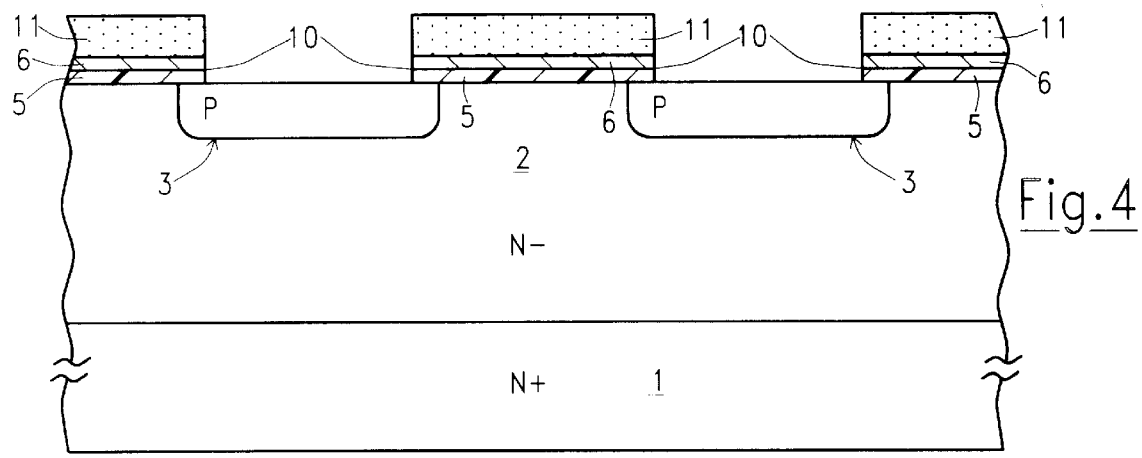

The body regions 3 of the elementary functional units of the MOS-gated power device are then formed. To this purpose, a P type dopant such as boron is implanted, using the polysilicon and oxide layers 5, 6 (and if necessary also the photoresist layer 11) as a mask, in a dose ranging from $5\times10^{13}$ to $5\times10^{14}$ atoms/cm², with an implantation energy in the range 80–200 keV (FIG. 3). As illustrated in FIG. 4, a subsequent thermal diffusion of the dopants forms the body regions 3 with a surface concentration in the channel region of approximately $10^{17}$ atoms/cm³, which is a concentration necessary to achieve the desired threshold voltage of the MOS-gated power device.

Alternatively, the body regions 3 can be formed by means of two distinct implants of boron in different doses and at different energies, still using the polysilicon and oxide layers 5, 6 as a mask.

For example, the first implant can involve a dose of a P type dopant in the range $10^{13}$–$10^{14}$ atoms/cm² with an energy of approximately 80 keV and is used to control the dopant concentration at the surface of the body regions, especially in the channel regions, which sets the desired threshold voltage of the MOS-gated power device. The second implant can involve, for example, a dose of P type dopant in the range $10^{14}$–$10^{15}$ atoms/cm² with an energy comprised between 100 keV and 300 keV, such that the peak concentration of the dopants can be located at a prescribed depth, namely under the source regions which will be formed in a later step. A subsequent thermal diffusion process at a temperature in the range 1050–1100° C. for 0.5 to 2 hours determines the lateral diffusion of the dopant introduced with the first implant, to form the channel regions of the body regions extending over the gate oxide layer. The vertical diffusion of the dopant introduced with the second implant does not alter the threshold voltage of the MOS-gated power device, because the dopant ions reach the surface with a concentration lower than the concentration of the dopant introduced with the first implant (in fact, the peak dopant concentration of the dopant introduced with the first implant is located substantially at the surface of the drain layer 2). The vertical and lateral diffusion of the dopants introduced with the second implant forms the heavily doped deep body portions of the body regions, reducing the resistivity of the body regions under the source regions.

Figure 5:
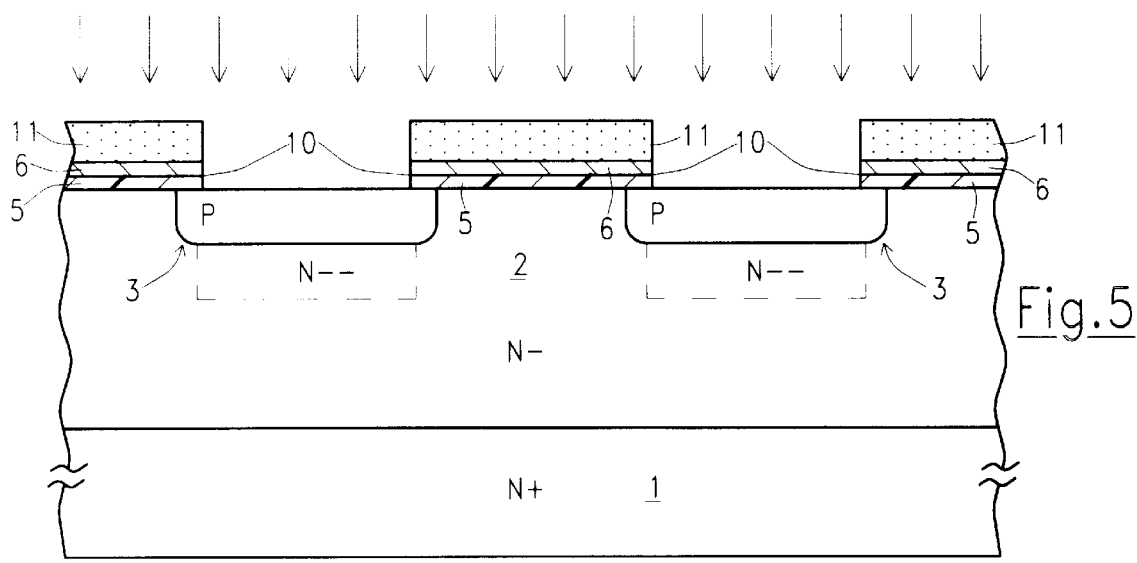

As illustrated in FIG. 5, a dopant of the P conductivity type, preferably one having a high diffusivity such as aluminum, is implanted into the epitaxial layer 2 using the polysilicon and oxide layers 5, 6 (and if necessary the photoresist layer 11) as a mask. The implant dose is suitable to partially compensate, but not to invert, the N type doping level of the epitaxial layer, so as to substantially increase the resistivity of those portions of the epitaxial layer 2 wherein such a dopant is implanted. The implantation energy (ranging from 700 keV to 1 MeV) is such as to locate the peak concentration of the dopant as close as possible to a body-drain junction (1.5–2 µm from the surface of the epitaxial layer 2).

Figure 5A:
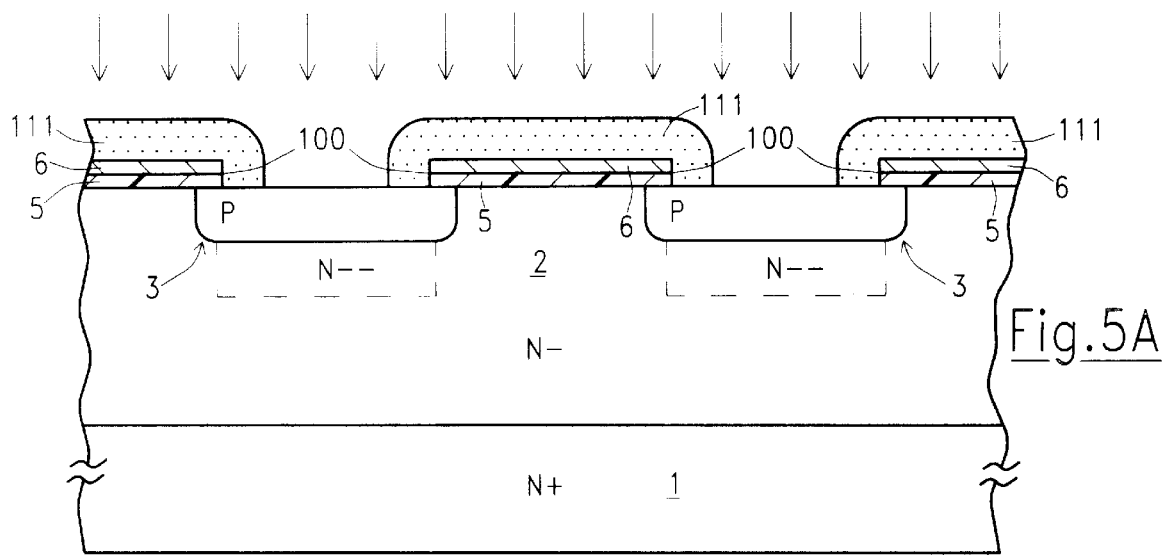
FIG. 5A is a cross-sectional view similar to FIG. 5, illustrating another embodiment of the manufacturing process.

Alternatively, as shown in FIG. 5A, the implant mask for the high-diffusivity dopant could be formed by another photoresist layer 111 with smaller openings 100 than the openings 10 in the polysilicon and oxide layers 5, 6.

Subsequently, a high dose of a N type dopant (such as arsenic or phosphorus) is then selectively implanted into the body regions 3 to form the source regions 4. The N type dopant is then made to diffuse by means of a thermal process. During such thermal process, the source dopant diffuses for a depth of about 0.4–0.5 µm in the case of arsenic, or about 0.6–0.7 µm in the case of phosphorus. During the same thermal process, the high-diffusivity dopant diffuses for a depth of about 1.5–2 µm, distributing in a controlled manner under all the body regions 3 substantially to the substrate 1, modifying the doping profile of the epitaxial layer 2 under the body regions 3 to increase the resistivity of the epitaxial layer 2 in these regions.

The following process steps involve forming a layer of insulating material 7 over the whole surface of the chip, openings contact windows in the insulating layer 7 over the body regions 3, and forming a source metal layer 8 and a drain metal layer 9.

If the thermal budget of the thermal diffusion process used to diffuse the source dopant is not sufficient to completely diffuse the high-voltage devices with a thick epitaxial layer, it is possible to modify the thermal diffusion process of the source dopant, or to invert the described sequence of steps, for example implanting the high-diffusivity dopant before the step of formation of the body regions 3, to exploit the thermal diffusion process of the body regions.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. MOS-grated power device, comprising: a plurality of elementary functional units, each elementary functional unit including a body region of a first conductivity type formed in a semiconductor material layer of a second conductivity type having a first resistivity value and at least one source region of a second conductivity formed in each body region of the plurality of elementary functional units; and a respective lightly doped region of the second conductivity type respectively disposed under each body region, each respective lightly doped region having a second resistivity value higher than the first resistivity value and having a substantially uniform cross-sectional area.

2. MOS-gated power device according to claim 1, wherein the second resistivity value of the lightly doped regions under the body regions determines a breakdown voltage of the MOS-gated power device.

3. MOS-gated power device according to claim 2, wherein the lightly doped regions of the second conductivity type contain dopants of the first conductivity type in a concentration suitable to partially compensate, but not to invert the conductivity type of, a concentration of dopant of the semiconductor material layer of the second conductivity type.

4. MOS-gated power device according to claim 3, wherein the dopants of the first conductivity type contained in said lightly doped regions of the second conductivity type have a high diffusivity in the semiconductor material layer.

5. MOS-gated power device according to claim 3, wherein the semiconductor material layer is superimposed over a heavily doped semiconductor substrate, the lightly doped regions under the body regions extending substantially to the semiconductor substrate.

6. MOS-gated power device according to claim 5, wherein the semiconductor substrate is of the second conductivity type.

7. MOS-gated power device according to claim 5, wherein the semiconductor substrate is of the first conductivity type.

8. MOS-gated power device according to claim 6 or 7, wherein the first conductivity type is the P type, and the second conductivity type is the N type.

9. MOS-gated power device according to claim 8, wherein the dopants of the first conductivity type contained in the lightly doped regions of the second conductivity type are aluminum atoms.

10. MOS-gated power device according to claim 6 or 7, wherein the first conductivity type is the N type, and the second conductivity type is the P type.

11. Process for the manufacturing of a MOS-gated power device, comprising the steps of:
    a) forming a lightly doped semiconductor layer of a first conductivity type and with a first resistivity value over a heavily doped semiconductor substrate;
    b) forming over the lightly doped semiconductor layer a conductive insulated gate layer;
    c) selectively removing the insulated gate layer to open windows over selected portions of a surface of the semiconductor layer;
    d) forming body regions of a second conductivity type in the semiconductor layer;
    e) forming source regions of the first conductivity type in the body regions; and
    f) forming under each body region a respective lightly doped region of a first conductivity type having an approximately uniform cross-sectional area that substantially extends in the semiconductor layer to the semiconductor substrate and having a second resistivity value that is higher than the first resistivity value of the semiconductor layer.

12. Process according to claim 11, wherein the lightly doped regions of the first conductivity type under the body regions are formed by implanting into the semiconductor layer of the first conductivity type a dopant of the second conductivity type in a dose suitable to partially compensate, but not to invert, a concentration of dopant of the first conductivity type of the semiconductor layer.

13. Process according to claim 12, wherein the dopant of the second conductivity type implanted to form the lightly doped regions under the body regions is a dopant having high diffusivity in the semiconductor layer.

14. Process according to claim 13, wherein the step of forming the source regions comprises a selective implant of a dopant of the first conductivity type and a subsequent thermal diffusion of the implanted dopant, and wherein the high diffusivity dopant implanted to for the lightly doped regions under the body regions is implanted before forming the source regions, and is thermally diffused in the semiconductor layer substantially down to the semiconductor substrate during the thermal diffusion of the implanted dopant forming the source regions.

15. Process according to claim 13, wherein the step of forming the body regions comprises implanting a dopant of the second conductivity type through the endows in the insulated gate layer and a subsequent thermal diffusion of the implanted dopant, and wherein the high diffusivity dopant implanted to form the lightly doped regions under the body regions is implanted before the formation of the body regions, and is thermally diffused in the semiconductor layer substantially down to the semiconductor substrate during the thermal-diffusion of the implanted dopant forming the body regions.

16. Process according to claim 14 or 15, wherein the high diffusivity dopant is implanted rough the windows in the insulated gate layer.

17. Process according to claim 14 or 15, wherein the high diffusivity dopant is implanted into a surface area of the semiconductor layer internal to the windows in the insulated gate layer.

18. Process according to any one of claims 13, 14, or 15, wherein the semiconductor substrate is of the first conductivity type.

19. Process according to any one of claims 13, 14, or 15, wherein the semiconductor substrate is of the second conductivity type.

20. Process according to claim 18, wherein the first conductivity type is N type, and the second conductivity type is P type.

21. Process according to claim 19, wherein the first conductivity type is N type and the second conductivity type is P type.

22. Process according to claim 20, wherein the high diffusivity dopant is aluminum.

23. Process according to claim 21, wherein the high diffusivity dopant is aluminum.

24. Process according to claim 22, wherein the aluminum dopant is implanted with an energy ranging from 500 keV to 1 MeV.

25. Process according to claim 23, wherein the aluminum dopant is implanted with an energy ranging from 500 keV to 1 MeV.

26. Process according to claim 18, wherein the first conductivity type is P type, and the second conductivity type is N type.

27. Process according to claim 19, wherein the first conductivity type is P type, and the second conductivity type is N type.

28. Process according to claim 16, wherein the semiconductor substrate is of the first conductivity type.

29. Process according to claim 28, wherein the first conductivity type is N type, and the second conductivity type is P type.

30. Process according to claim 29, wherein the high diffusivity dopant is aluminum.

31. Process according to claim 30, wherein the aluminum dopant is implanted with an energy ranging from 500 keV to 1 MeV.

32. Process according to claim 28, wherein the first conductivity type is P type and the second conductivity type is N type.

33. Process according to claim 17, wherein he semiconductor substrate is of the first conductivity type.

34. Process according to claim 33, wherein the first conductivity type is N type and the second conductivity type is P type.

35. Process according to claim 34, wherein the high diffusivity dopant is aluminum.

36. Process according to claim 35, wherein the aluminum dopant is implanted with an energy ranging from 500 keV to 1 MeV.

37. Process according to claim 33, wherein the first conductivity type is P type, and the second conductivity type is N type.

38. Process according to claim 16, wherein the semiconductor substrate is of the second conductivity type.

39. Process according to clam 38, wherein the first conductivity type is N type, and the second conductivity type is P type.

40. Process according to claim 39, wherein the high diffusivity dopant is aluminum.

41. Process according to claim 40, wherein the aluminum dopant is implanted with an energy ranging from 500 keV to 1 MeV.

42. Process according to claim 41, wherein the first conductivity type is P type, and the second conductivity type is N type.

43. Process according to claim 17, wherein the semiconductor substrate is of the second conductivity type.

44. Process according to claim 43, wherein the first conductivity type is N type, and the second conductivity type is P type.

45. Process according to claim 44, wherein the high diffusivity dopant is aluminum.

46. Process according to claim 45, wherein the aluminum dopant is implanted with an energy ranging from 500 keV to 1 MeV.

47. Process according to claim 43, wherein the first conductivity type is P type, and the second conductivity type is N type.

48. The MOS-gated power device of claim 1, wherein a concentration of dopants of the second conductivity type in each of the respective lightly doped regions varies with a distance from the body region under which it is disposed.

49. The MOS-gated power device of claim 2, wherein a cross-sectional width of each respective lightly doped region is approximately the same as a cross-sectional width of the body region it is respectively disposed under.

50. The MOS-gated power device of claim 2, wherein a depth of each respective lightly doped region is approximately the same as a cross-sectional width of the body region it is respectively disposed under.

51. A MOS-gated power device, comprising:
a heavily doped semiconductor substrate;
a lightly doped epitaxial layer of a first conductivity type formed on the heavily doped semiconductor substrate, the lightly doped epitaxial layer having a resistance,
a plurality of body regions of a second conductivity type formed in the epitaxial layer;
at least one source region of the first conductivity type formed in each of the plurality of body regions; and
means, formed in the epitaxial layer under each of the plurality of body regions, for increasing the resistance of the epitaxial layer under each of the plurality of body regions without appreciably changing the resistance of the epitaxial layer between each of the plurality of body regions.

52. The device of claim 51, wherein the resistance of the epitaxial layer under each of the plurality of body regions determines a breakdown voltage of the device.

53. The device of claim 51, wherein the means for increasing includes means for reducing an effective dopant level of the first conductivity type in the epitaxial layer under each of the plurality of body regions.

54. The device of claim 53, wherein the means for reducing the effective dopant level of the first conductivity type partially compensates for dopants of the first conductivity type in the epitaxial layer but does not invert the conductivity type of the epitaxial layer.

55. The device of claim 53, wherein the means for reducing the effective dopant level of the first conductivity type includes dopants of the second conductivity type diffused in the epitaxial layer under each of the plurality of body regions.

56. The device of claim 55, wherein a number of dopants of the second conductivity type are diffused in the epitaxial layer under each of the plurality of body regions to partially compensate for dopants of the first conductivity type in the epitaxial layer without inverting the conductivity type of the epitaxial layer under each of the plurality of body regions.

57. The device of claim 55, wherein the dopants of the second conductivity type have a high diffusivity in the epitaxial layer.

58. The device of claim 51, wherein the means for increasing the resistance includes means for increasing the resistance of the epitaxial layer directly below each of the body regions without appreciably decreasing the resistance of the epitaxial layer between each of the plurality of body regions.

59. The device of claim 51, wherein the means for increasing is formed in the epitaxial layer directly below each of the plurality of body regions.

60. The device of claim 51, wherein the means for increasing has a substantially uniform cross-sectional area.

61. The device of claim 51, wherein each respective body region of the plurality of body regions has a cross-sectional width, and wherein the means for increasing has a cross-sectional width that is approximately equal to the cross-sectional width of the respective body region under which it is disposed.

62. The device of claim 51, wherein the means for increasing includes a concentration of dopants of the first conductivity type that varies in a direction from the body region toward the heavily doped semiconductor substrate.

63. A MOS-gated power device, comprising:
a heavily doped semiconductor substrate;
a lightly doped epitaxial layer of a first conductivity type formed on the heavily doped semiconductor substrate, the lightly doped epitaxial layer having a resistance;
a plurality of body regions of a second conductivity type formed in the epitaxial layer, each of the plurality of body regions being separated from each other by a distance;
at least one source region of the first conductivity type formed in each of the plurality of body regions; and
means, formed in the epitaxial layer below each of the plurality of body regions, for reducing the distance separating each of the plurality of body regions without appreciably changing the resistance of the epitaxial layer between each of the plurality of body regions.

64. The device of claim 63, wherein the means for reducing the distance includes means for reducing the distance separating each of the plurality of body regions without appreciably decreasing the resistance of the epitaxial layer between each of the plurality of body regions.

65. The device of claim 63, wherein the device has a breakdown voltage, and wherein the means for reducing the distance includes means for reducing the distance separating each of the plurality of body regions without appreciably reducing the breakdown voltage of the device.

* * * * *